US012175569B2

(12) United States Patent
Takahashi et al.

(10) Patent No.: US 12,175,569 B2
(45) Date of Patent: Dec. 24, 2024

(54) TERMINAL DEVICE AND RF POWER SUPPLY DEVICE

(71) Applicant: HITACHI KOKUSAI ELECTRIC INC., Tokyo (JP)

(72) Inventors: Naoto Takahashi, Tokyo (JP); Yoshiyuki Oshida, Tokyo (JP); Naoya Fujimoto, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 38 days.

(21) Appl. No.: 17/799,762

(22) PCT Filed: Jan. 7, 2021

(86) PCT No.: PCT/JP2021/000360
§ 371 (c)(1),
(2) Date: Aug. 15, 2022

(87) PCT Pub. No.: WO2021/181852
PCT Pub. Date: Sep. 16, 2021

(65) Prior Publication Data
US 2023/0072008 A1    Mar. 9, 2023

(30) Foreign Application Priority Data
Mar. 11, 2020    (JP) .................. 2020-041472

(51) Int. Cl.
*G06T 11/20*    (2006.01)
*G01R 29/08*    (2006.01)
(Continued)

(52) U.S. Cl.
CPC ............ *G06T 11/206* (2013.01); *G01R 29/08* (2013.01); *G06T 11/001* (2013.01); *G06T 11/60* (2013.01);
(Continued)

(58) Field of Classification Search
None
See application file for complete search history.

(56) References Cited

U.S. PATENT DOCUMENTS 6,005,193 A  * 12/1999  Markel ............... H01B 7/0018
                                                       174/117 FF
10,395,897 B1 *  8/2019  Wi .................... H01J 37/32183
(Continued)

FOREIGN PATENT DOCUMENTS

JP    2006-253364 A    9/2006
JP    2008-092680 A    4/2008
(Continued)

OTHER PUBLICATIONS

Recordingofnature, "Visualisation of directional frequency response", posted Feb. 12, 2011, https://recordingsofnature.wordpress.com/2011/02/12/visualisation-of-directional-frequency-response/ (Year: 2011).*

(Continued)

*Primary Examiner* — Sarah Le
(74) *Attorney, Agent, or Firm* — BACON&THOMAS, PLLC

(57) ABSTRACT

There is provided a terminal device for displaying status information of a plurality of RF generators. On a display screen, numerical values of a specific item of the status information are displayed as figures having different lengths, and values of another item different from the specific item are displayed in at least one of color tones, patterns, or shapes of the figures, and when the specific item is a frequency and the another item is a phase, output powers of the plurality of RF generators are displayed as figures of bar graphs over the frequency, and phases of the RF generators are displayed in at least one of color tones, patterns, or shapes of the corresponding figures.

9 Claims, 10 Drawing Sheets

SCHEMATIC CONFIGURATION OF DEVICE OF PRESENT DISCLOSURE

(51) Int. Cl.
  *G06T 11/00* (2006.01)
  *G06T 11/60* (2006.01)
  *H01J 37/32* (2006.01)
  *G06F 3/0484* (2022.01)

(52) U.S. Cl.
  CPC ...... *H01J 37/32935* (2013.01); *G06F 3/0484* (2013.01); *G06T 2200/24* (2013.01)

(56) References Cited

U.S. PATENT DOCUMENTS

| | | | | |
|---|---|---|---|---|
| 2009/0213020 | A1* | 8/2009 | Rentz | H01Q 21/30 343/722 |
| 2014/0057235 | A1* | 2/2014 | Kellum | G09B 23/288 434/265 |
| 2015/0048740 | A1* | 2/2015 | Valcore, Jr. | H01J 37/3255 315/111.21 |
| 2017/0061156 | A1* | 3/2017 | Hamamoto | G06F 21/6254 |
| 2021/0050185 | A1* | 2/2021 | Martinez | H01J 37/32165 |

FOREIGN PATENT DOCUMENTS

| | | |
|---|---|---|
| JP | 2008-311580 A | 12/2008 |
| WO | 2015-151165 A1 | 10/2015 |

OTHER PUBLICATIONS

Siglent, "SVA Options: How do I know what is activated/available?" posted Oct. 1, 2019 https://www.siglenteu.com/operating-tip/sva-options-activated-available/ (Year: 2019).*

Fernández de Gorostiza, Erlantz, et al. "A method for dynamically selecting the best frequency hopping technique in industrial wireless sensor network applications." Sensors 18.2 (2018): 657. (Year: 2018).*

Quadri, Christian, et al. "Feature-rich ego-network circles in mobile phone graphs: tie multiplexity and the role of alters." 2018 IEEE/ACM International Conference on Advances in Social Networks Analysis and Mining (ASONAM). IEEE, 2018. (Year: 2018).*

Arubanetworks, "Customizing Spectrum Analysis Graphs"; posted Jan, 1, 2015, https://www.arubanetworks.com/techdocs/ArubaOS_64x_WebHelp/Content/ArubaFrameStyles/Spectrum_Analysis/Customizing_Spectrum_Ana.htm (Year: 2015).*

International Search Report dated Apr. 6, 2021.

* cited by examiner

BLOCK DIAGRAM OF TERMINAL DEVICE

INITIAL SCREEN

FREQUENCY-BASED SCREEN

PHASE-BASED SCREEN

ANOTHER PHASE-BASED SCREEN

FIG. 7

| PHASE | R | G | B |
|---|---|---|---|
| 0°~60° | 255 | 0~255 | 0 |
| 60°~120° | 255~0 | 255 | 0 |
| 120°~180° | 0 | 255 | 0~255 |
| 180°~240° | 0 | 255~0 | 255 |
| 240°~300° | 0~255 | 0 | 255 |
| 300°~360° (0°) | 255 | 0 | 255~0 |

COMPOSITION OF PHASE DISPLAY COLORS

FIG.8

| FREQUENCY (MHz) | R | G | B |
|---|---|---|---|
| 25.00~27.50 | 255 | 0~255 | 0 |
| 27.50~30.00 | 255~0 | 255 | 0 |
| 30.00~32.50 | 0 | 255 | 0~255 |
| 32.50~35.00 | 0 | 255~0 | 255 |

COMPOSITION OF FREQUENCY DISPLAY COLORS

FREQUENCY-BASED SCREEN DISPLAYING
FREQUENCY CHANGE OVER TIME

FIG.10

| | FORWARD WAVE | FREQUENCY | PHASE |
|---|---|---|---|
| RFG1 | NUMERICAL VALUE | NUMERICAL VALUE | NUMERICAL VALUE |
| RFG2 | NUMERICAL VALUE | NUMERICAL VALUE | NUMERICAL VALUE |
| ⋮ | ⋮ | ⋮ | ⋮ |
| RFGn | NUMERICAL VALUE | NUMERICAL VALUE | NUMERICAL VALUE |

CONVENTIONAL STATUS DISPLAY EXAMPLE OF RF GENERATOR

TERMINAL DEVICE AND RF POWER SUPPLY DEVICE

TECHNICAL FIELD

The present disclosure relates to a terminal device for displaying a status of a forward wave, a frequency, or the like of a radio frequency (RF) generator for a semiconductor manufacturing device using plasma processing or a flat panel display (FPD) manufacturing device; and, more particularly, to a terminal device and an RF generator that easily displays the status of the RF generator.

BACKGROUND

Prior Art

Conventionally, in a large-scale manufacturing device such as an FPD manufacturing device or the like, a plurality of RF generators of ten or more may be used for operation.

An operator causes a terminal device such as a personal computer (PC) or the like to display status information of the RF generators by an application for displaying the status of the RF generators.

The status information of the RF generators includes, e.g., numerical values of a frequency, a forward wave, a reflected wave, a phase, and the like.

The operator refers to the status information of the RF generators displayed on the terminal device to determine whether or not the status information of each RF generator in a current process is appropriate and to adjust the RF generator individually depending on the numerical values of the status information.

(Status Display Example of Conventional RF Generator: FIG. 10)

A status display example of an RF generator in a conventional terminal device will be described with reference to FIG. 10. FIG. 10 schematically shows the status display example of the conventional RF generator.

In the conventional terminal device, as shown in FIG. 10, numerical values of a frequency and a phase of a forward wave are displayed for each RF generator (RFG).

(Related Art)

A related prior art may be disclosed in International Publication No. 2015/151165 "Power Supply Device and Impedance Matching Method" (Patent Document 1).

Patent Document 1 discloses a power supply device that efficiently impedance-matches an output power from an RF generator with a load.

PRIOR ART DOCUMENTS

Patent Documents

Patent Document 1: International Publication No. 2015/151165

SUMMARY

Problems to Be Resolved by the Invention

However, in the conventional terminal device that displays the status information of the RF generator, the status information is a list of numerical values, so an operator must determine the status of the RF generator by looking at the individual numerical values. Therefore, the more RF generators there are, the more difficult it is to intuitively recognize the status of the RF generator at first glance, and the more difficult it is to determine whether the state is good or bad and whether adjustment is necessary or not.

Patent Document 1 does not disclose a configuration for easily displaying the status information of the RF generator.

In view of the above, the present disclosure provides a terminal device and an RF generator capable of intuitively and easily displaying the status information on the RF generator in a process and easily determining whether the state is good or bad and whether adjustment is necessary or not.

Means for Solving the Problem

The present disclosure for solving the problems of the above-mentioned conventional example relates to a terminal device for displaying status information of a plurality of RF generators, and is characterized in that, on a display screen, numerical values of a specific item of the status information are displayed as figures having different lengths, and values of another item different from the specific item are displayed in at least one of color tones, patterns, or shapes of the figures.

The present disclosure is characterized in that, in the above terminal device, when the specific item is a frequency and the another item is a phase, output powers of the plurality of RF generators are displayed as figures of bar graphs over the frequency, and phases of the RF generators are displayed in at least one of color tones, patterns, or shapes of the corresponding figures.

The present disclosure is characterized in that, in the above terminal device, when the specific item is a phase and the another item is a frequency, phases of the plurality of RF generators are displayed as figures on circles, and frequencies of the RF generators are displayed in least one of color tones, patterns, or shapes of the corresponding figures.

The present disclosure is characterized in than, in the above terminal device, a progress of impedance matching with a load is displayed, a bar graph at the start of the impedance matching and a bar graph at the completion of the impedance matching are displayed, and a line graph indicating frequency fluctuation during the progress is displayed.

The present disclosure is characterized in that, in the above terminal device, a selection screen on which a specific item of the status information is selectable is displayed.

The present disclosure is characterized in that, in the above terminal device, when the figures are displayed, a set value set by an operator is displayed.

The present disclosure relates to a terminal device for displaying status information of a plurality of RF generators, and is characterized in that, on a display screen, figures for the plurality of RF generators are displayed on circles indicating phases for output power values, and frequencies of the RF generators are displayed in at least one of color tones, patterns, or shapes of the corresponding figures.

The present disclosure relates to an RF generator comprising the terminal device described above.

Effect of the Invention

The terminal device according to the present disclosure displays status information of a plurality of RF generators, displays numerical values of a specific item of the status information in figures having different length on a display screen, and displays values of another item different from the specific item in at least one of color tones, patterns, or shapes of the figures on the display screen. Therefore, the status information of the RF generator can be displayed in figures so that it can be intuitively and easily recognized. Also, it is possible to easily determine whether or not the state of the RF generator is good or bad or whether adjustment is necessary or not.

BRIEF DESCRIPTION OF THE DRAWINGS

FIG. 7 shows a composition of phase display colors.

FIG. 8 shows a composition of frequency display colors.

FIG. 10 schematically shows a status display example of a conventional RF generator.

DETAILED DESCRIPTION

An embodiment of the present disclosure will be described with reference to the accompanying drawings.
(Outline of Embodiment)

Figure 1:
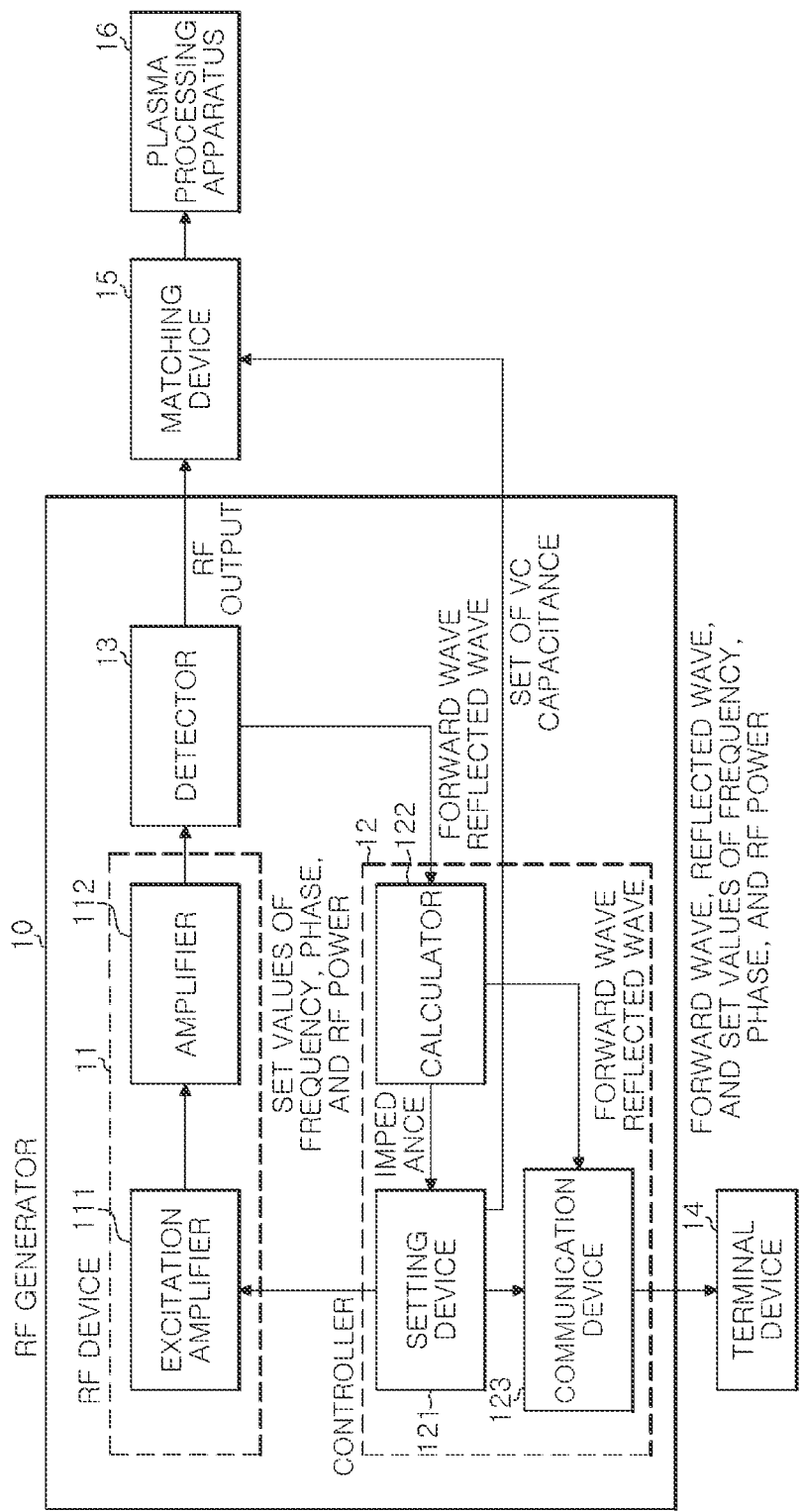
FIG. 1 shows a schematic configuration of a device of the present disclosure.

A radio frequency (RF) generator (the device of the present disclosure) according to an embodiment of the present disclosure includes a terminal device that displays status information such as a forward wave, a reflected wave, a frequency, a phase or the like of an RF generator. The terminal device displays the status information of the RF generator such as a frequency, a phase, or the like in figures so that it can be intuitively and easily recognized. Accordingly, it is possible to easily determine whether the state of the RF generator is good or bad or whether adjustment is necessary or not.
(Device of the Present Disclosure: FIG. 1)

The device of the present disclosure will be described with reference to FIG. 1. FIG. 1 shows a schematic configuration of the device of the present disclosure. FIG. 1 also shows an example in which the device of the present disclosure is connected to a plasma processing apparatus.

As shown in FIG. 1, the device of the present disclosure basically includes an RF generator 10 and a terminal device 14. A matching device 15 is connected to the RF generator 10, and a plasma processing apparatus 16 is connected to the matching device 15.

Generally, the terminal device 14 is connected to a plurality of RF generators 10 and configured to display the status information of the plurality of RF generators 10 on one screen.
(Individual Component of Device of the Present Disclosure)

The individual component of the device of the present disclosure will be explained.

The RF generator 10 of the device of the present disclosure includes an Rf device 11, a controller 12, and a detector 13.

The Rf device 11 includes an excitation amplifier 111 and an amplifier 112.

The controller 12 includes a setting device 121, a calculator 122, and a communication device 123.

The excitation amplifier 111 of the Rf device 11 generates a reference signal having a predetermined frequency and outputs the reference signal to the amplifier 112.

The amplifier 112 amplifies the power of the reference signal inputted from the excitation amplifier 111 to generate an RF power signal, and outputs the RF power signal to the detector 13.

The detector 13 is composed of, e.g., a capacitive/mutual inductance coupling (CM) type directional coupler, and outputs the RF power signal (RF output) inputted from the amplifier 112 to the matching device 15. Further, the detector 13 detects voltages indicating the magnitudes of a forward wave and a reflected wave included in the RF power signal and outputs them to the controller 12.

The matching device 15 matches an output impedance of the RF generator 10 with an input impedance of the plasma processing apparatus 16, and has a fixed matching element such as a fixed coil or the like and a variable matching element such as a variable capacitor (VC) or the like. The VC capacitance of the variable capacitor is set by the controller 12, and the variable capacitor adjusts the impedance matching.

The RF power signal whose impedance is matched by the matching device 15 is inputted to the plasma processing apparatus 16, and the plasma processing apparatus 16 generates plasma to perform plasma processing such as plasma asking or the like on a substrate for manufacturing a semiconductor integrated circuit or the like.

The calculator 122 of the controller 12 performs AD conversion and digital signal processing on the voltages of the forward wave and the reflected wave inputted from the detector 13, and outputs the power values of the forward wave and the reflected wave to the communication device 123. Further, the calculator 122 calculates impedance values from the forward wave and the reflected wave, and the phases thereof, and outputs the impedances value to the setting device 121.

The setting device 121 of the controller 12 outputs the set values of the frequency, the phase, and the RF power to the excitation amplifier 111 of the Rf device 11, and outputs them to the communication device 123.

Further, the setting device 121 receives the impedance value from the calculator 122, and outputs the set value of the VC capacitance to the matching device 15 based on the impedance value.

The communication device 123 of the controller 12 receives the set values of the frequency, the phase, and the RF power from the setting device 121, receives the voltages of the forward wave and the reflected wave from the calculator 122, and outputs them to the terminal device 14.

Figure 2:
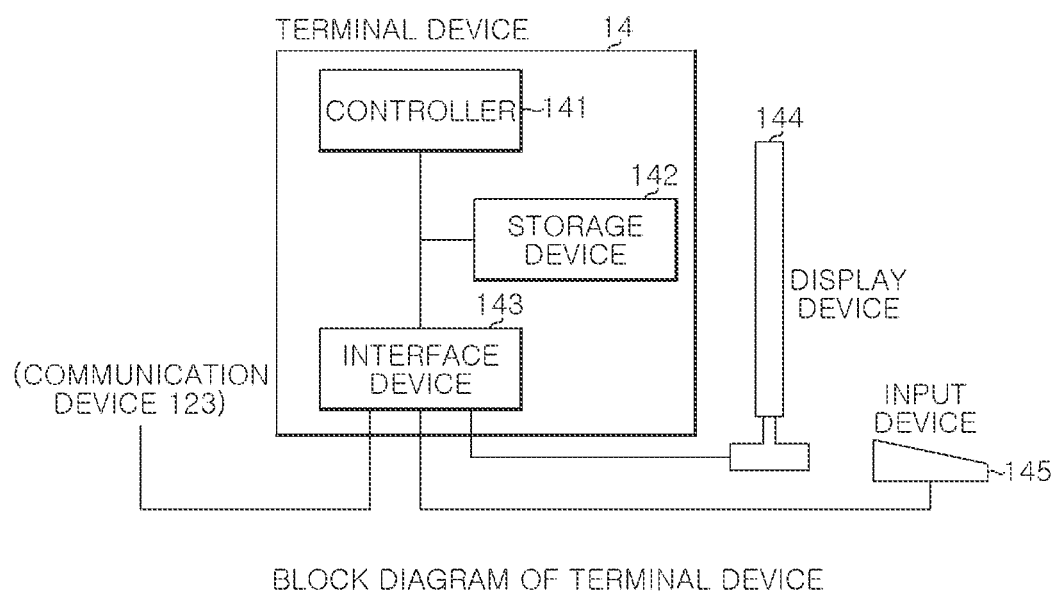
FIG. 2 is a block diagram of a terminal device.

The terminal device 14 receives the voltages of the forward wave and the reflected wave voltage, and the set values of the frequency, the phase, and the RF power from the communication device 123, and displays them as the status information on a display device. The present embodiment is characterized by a display method in the terminal device 14.
(Terminal Device 14: FIG. 2)

Next, the terminal device 14 will be described with reference to FIG. 2. FIG. 2 is a block diagram of the terminal device.

The terminal device 14 is a processing device such as a personal computer or the like, and includes a controller 141, a storage device 142, an interface device 143, a display device 144, and an input device 145, as shown in FIG. 2.

The controller 141 operates a processing program (application) stored in the storage device 142, and causes the display device 144 to display the voltages of the forward wave and the reflected wave and the set values of the frequency, the phase, and the RF power transmitted from the communication device 123 as the status information.

The storage device 142 stores the application, the status information, other data required for processing, parameters, and the like.

The interface device 143 is connected to the communication device 123 of the RF generator 10, and is also connected to the display device 144 and the input device 145.

The display device 144 can intuitively and easily display the status information of the RF generator, so that it is possible to easily determine whether the state of the RF generator is good or bad and whether adjustment is necessary or not.

Instructions to operate the application and instructions to select the status information to be displayed on the display device 144 are inputted to the input device 145.

(Display Example on Terminal Device 14: FIGS. 3 to 9)

Figure 3:
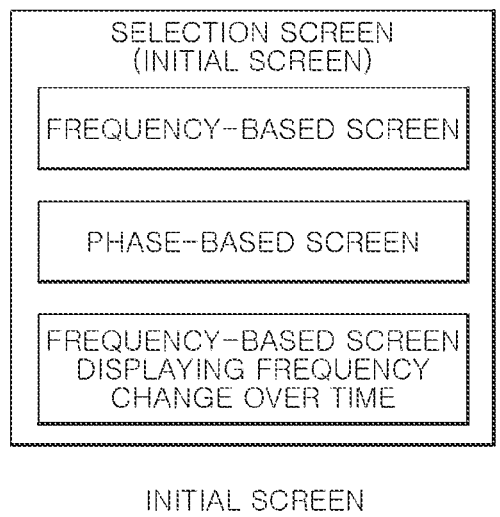
FIG. 3 schematically shows an initial screen in the case of operating an application.
Figure 4:
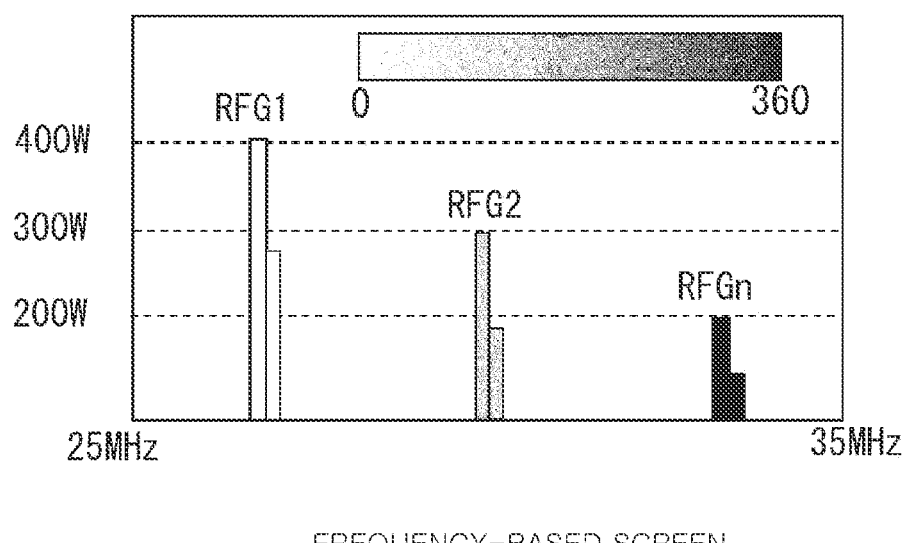
FIG. 4 schematically shows a frequency-based screen.
Figure 5:
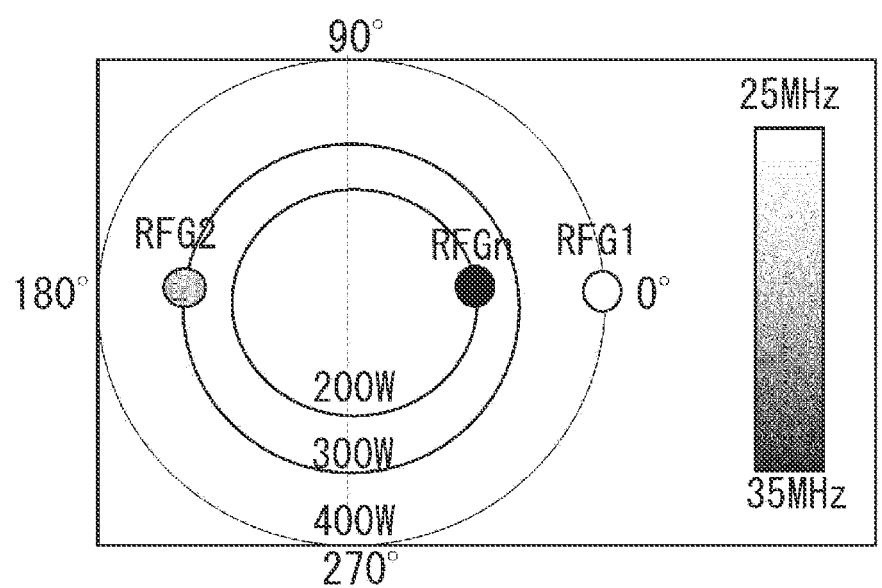
FIG. 5 schematically shows a phase-based screen.
Figure 6:
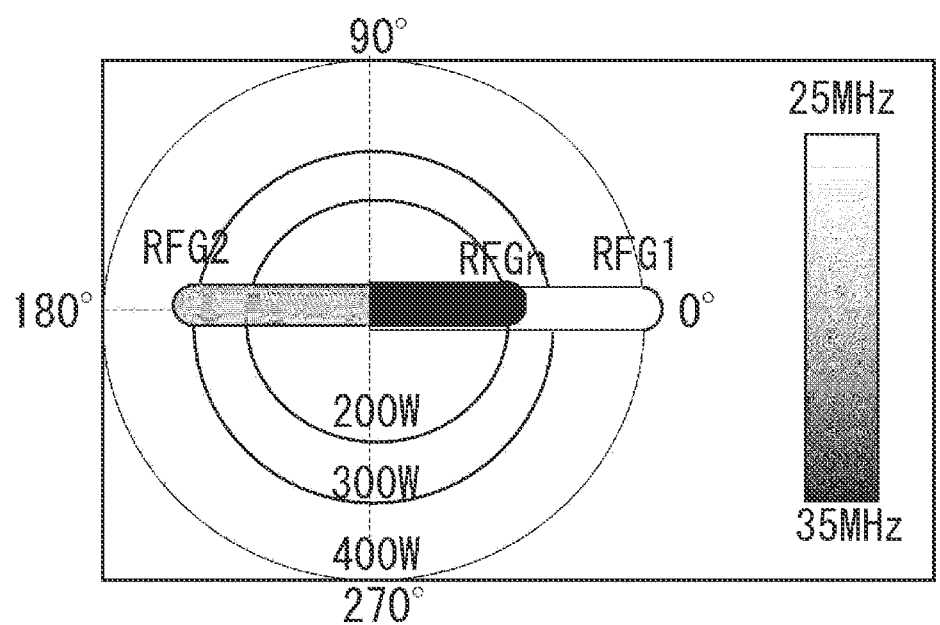
FIG. 6 schematically shows another phase-based screen.
Figure 9:
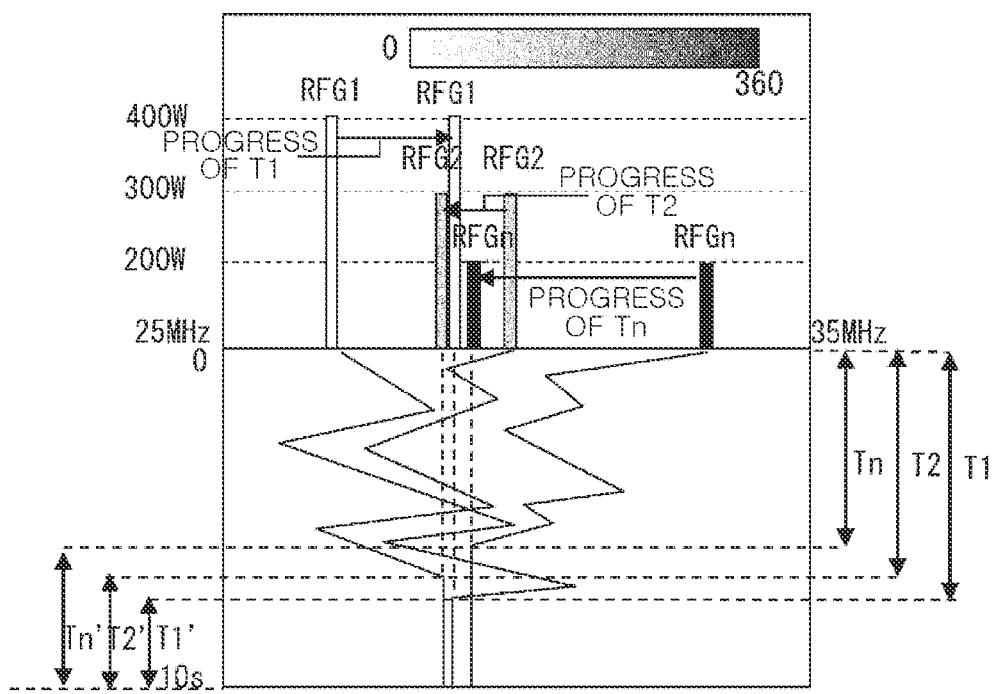
FIG. 9 schematically shows a frequency-based screen displaying a frequency change over time.

Next, a display example in the terminal device 14 in the device of the present disclosure will be described with reference to FIGS. 3 to 9. FIG. 3 schematically shows an initial screen in the case of operating an application. FIG. 4 schematically shows a frequency-based screen. FIG. 5 schematically shows a phase-based screen. FIG. 6 schematically shows another phase-based screen. FIG. 7 shows a composition of phase display colors. FIG. 8 shows a composition of frequency display colors. FIG. 9 schematically shows a frequency-based screen displaying a frequency change over time.

(Initial Screen: FIG. 3)

When the application operates in the terminal device 14, an initial screen (TOP screen) of FIG. 3 is displayed.

FIG. 3 is a selection screen for selecting the status information of the RF generator where the frequency-based screen, the phase-based screen, and the like can be selected.

By making it possible to switch the frequency-based screen and the phase-based screen, an operator can obtain information that he/she wants to emphasize each time.

(Frequency-Based Screen: FIG. 4)

When the frequency-based screen is selected from the input device 145 on the initial screen of FIG. 3, the frequency-based screen of FIG. 4 is displayed on the display device 144. The initial screen of FIG. 3 may be displayed as a selection menu on a part of the corresponding screen together with the screens of FIG. 4 and FIGS. 5 and 6 to be described later.

In FIG. 4, the horizontal axis represents a frequency (25 MHz to 35 MHz), the vertical axis represents a power (0 W to 400 W). The power values of the forward wave (left side) and the reflected wave (right side) for a plurality of RF generators RFG1 to RFGn are displayed as bar graphs. The RF generators RFG1 to RFGn are arranged depending on the frequency.

The bar graphs are color-coded depending on the phase, and the phase information can be displayed at the same time. The color coding of the phase will be described later. In the claims, it is stated that the color coding of the figures are displayed in the color tones of the figures.

In addition, if the set values set by the operator are also displayed together with the figures such as bar graphs, pie charts, line graphs, and the like, the set values can be compared with the figures, and the status information can be easily recognized.

(Phase-Based Screen: FIG. 5)

When the phase-based screen is selected from the input device 145 on the initial screen of FIG. 3, the phase-based screen of FIG. 5 is displayed on the display device 144.

In FIG. 5, figures on circles indicate phases for output power values. A circle of 400 W, a circle of 300 W, and a circle of 200 W are displayed in that order from the outer side toward the inner side to correspond to a plurality of RF generators. Further, auxiliary lines indicating the phases of 0°, 90°, 180°, and 270° are displayed in a cross shape.

The round shapes displayed on the circles indicate the phases of the RF generators. For example, RFG1 has a power value of 400 W and a phase of 0°.

The round shapes are color-coded depending on the frequency, and the frequency information can be displayed at the same time. The color coding of the frequency will be described later.

The shape displayed on the circle and indicating each RF generator is not limited to the round shape.

(Another Phase-Based Screen: FIG. 6)

Next, FIG. 6 shows a modification of FIG. 5. In FIG. 6, the phase state of each RF generator is displayed in a rod (bar) shape instead of the round shape on the circle. In other words, the direction of the rod indicates the phase, and the length of the rod indicates the power value of the RF generator.

The rod shape is also color-coded depending on the frequency. At the portion where the rods overlap, the color of the shorter rod is preferentially displayed.

(Composition of Phase Display Color: FIG. 7)

As shown in FIG. 7, the phase display color is set such that the gray level values of R (red), G (green), and B (blue) change depending on the phase value. The numerical values of the gray level are within a range of 0 to 255. Here, 0 indicates no color, and 255 indicates a darkest color.

For example, when the phase changes from 0° to 60° (between 0° and 60°), R is fixed at 255, G changes within a range of 0 to 255 as the phase value increases, and B is fixed at 0. When the gray level changes from 0 to 255, the value of the gray level is changed (increased) by 4.25 per 1° of the phase. However, since the set value of the gray level is an integer, the value after the decimal point of the calculation result is ignored.

Therefore, in the case that the phase changes from 0° to 60°, the green gradually enters red, and the phase display color becomes orange color when "R is 255, G is 255, and B is 0".

In the case that the phase changes from 60° to 120°, R changes from 255 to 0, G is fixed at 255, and B is fixed at 0. The gray level of red is changed (decreased) by 4.25 per 1° of the phase.

Therefore, in the case that the phase changes from 60° to 120°, the red gradually disappears from the orange color, and the phase display color passes through yellowish green and becomes green when "R is 0, G is 255, and B is 0".

In the case that the phase changes from 120° to 180°, R is fixed at 0, G is fixed at 255, and B changes from 0 to 255. The gray level of blue is changed (increased) by 4.25 per 1° of the phase.

Therefore, in the case that the phase changes from 120° to 180°, the blue gradually enters the green, and the phase display color passes through blue-green and becomes light blue when "R is 0, G is 255, and B is 255".

In the case that the phase changes from 180° to 240°, R is fixed at 0, G changes from 255 to 0, and B is fixed at 255. The gray level of green is changed (decreased) by 4.25 per 1° of the phase.

Therefore, in the case that the phase changes from 180° to 240°, the green gradually disappears from the light blue, and the phase display color becomes blue when "R is 0, G is 0, and B is 255".

In the case that the phase changes from 240° to 300°, R changes from 0 to 255, G is fixed at 0, and B is fixed at 255. The gray level of red is changed (increased) by 4.25 per 1° of the phase.

Therefore, in the case that the phase changes from 240° to 300°, the red gradually enters the blue, and the phase display color becomes purple when "R is 255, G is 0, and B is 255".

In the case that the phase changes from 300° to 360° (0°, R is fixed at 255, G is fixed at 0, and B changes from 255 to 0. The gray level of blue is changed (decreased) by 4.25 per 1° of the phase.

Therefore, in the case that the phase changes from 300° to 360°, the blue gradually disappears from the purple, and the phase display color returns to red when "R is 255, G is 0, and B is 0".

The display color change caused by the phase change is used for the display of the bar graphs (the display based on the phase value) on the frequency-based screen in FIG. 4.

(Composition of Frequency Display Color: FIG. 8)

As shown in FIG. 8, the frequency display color is set such that the gray levels of R (red), G (green), and B (blue) change depending on the frequency value. The numerical values of the gray level are the same as those described in the phase display color.

For example, in the case that the frequency changes from 25.00 MHz to 27.50 MHz, R is fixed at 255, G changes from 0 to 255 as the frequency value increases, and B is fixed at 0. When the gray level changes from 0 to 255, the gray level is changed (increased) by 1.02 per 0.01 MHz of the frequency. However, since the set value of the gray level is an integer, the value after the decimal point of the calculation result is ignored.

Therefore, in the case that the frequency changes from 25.00 MHz to 27.50 MHz, the green gradually enters the red, and the frequency display color becomes orange color when "R is 255, G is 255, and B is 0".

In the case that the frequency changes from 27.50 MHz to 30.00 MHz, R changes from 255 to 0, G is fixed at 255, and B is fixed at 0. The gray level of red is changed (decreased) by 1.02 per 0.01 MHz of the frequency.

Therefore, in the case that the frequency changes from 27.50 MHz to 30.00 MHz, the red gradually disappears from the orange color, and the frequency display color passes through yellowish green and becomes green when "R is 0, G is 255, and B is 0".

In the case that the frequency changes from 30.00 MHz to 32.50 MHz, R is fixed at 0, G is fixed at 255, and B changes from 0 to 255. The gray level of blue is changed (increased) by 1.02 per 0.01 MHz of the frequency.

Therefore, in the case that the frequency change 30.00 MHz to 32.50 MHz, the blue gradually enters the green, and the frequency display color passes blue-green and becomes light blue when "R is 0, G is 255, and B is 255".

In the case that the frequency changes from 32.50 MHz to 35.00 MHz, R is fixed at 0, G changes from 255 to 0, and B is fixed at 255. The gray level of green is changed (decreased) by 1.02 per 0.01 MHz of the frequency.

Therefore, in the case that the frequency changes from 32.50 MHz to 35.00 MHz, and the frequency display color becomes blue when "R is 0, G is 0, and B is 255".

The display color change caused by the frequency change is used for the display of the round shape on the phase-based screen in FIG. 5 and the display of the rod shape on the phase-based screen in FIG. 6 (the displays based on the frequency value).

(Frequency-Based Screen that Displays Frequency Change Over Time: FIG. 9)

When the RF generator changes its frequency to perform impedance matching with the plasma load (plasma processing apparatus), an operator who operates the terminal device 14 may want to observe the transition state of the frequency over time in the n-number of RF generators.

In this case, the graph having the vertical axis representing the time and the horizontal axis representing the frequency is added and displayed at the lower part of the frequency-based screen shown in FIG. 9. Accordingly, it is possible to observe the transition state of the plurality of RF generators during the impedance matching.

FIG. 9 will be described in detail.

The bar graph of FIG. 9 is displayed at the upper part of FIG. 9. The frequency bar at the start of the matching operation and the frequency bar during the matching operation or at the completion of the matching operation (at the time of convergence) are displayed as a set.

Further, at the lower part of FIG. 9, the frequency fluctuation is displayed as the line graph in which the upper side of the vertical axis (time) corresponds to the time when the matching operation is started and the lower side corresponds to the time of convergence (the time when the matching operation is completed).

It is possible to observe, from FIG. 9, the frequency change caused by the impedance matching operation of each RF generator, the matching operation time, and the elapsed time from the completion of the matching.

Times T1 to Tn indicate the matching operation time of the plurality of RF generators (RFG1 to RFGn), and times T1' to Tn' indicate the elapsed time from the completion of the matching operations of RFG1 to RFGn.

In order to help the understanding of the line graph at the lower part of FIG. 9, the same color as the display color of the bar is used.

(Effect of Embodiment)

In accordance with the device of the present disclosure, the terminal device 14 connected to the RF generator 10 displays the powers of the forward waves and the reflected waves of the plurality of RF generators 10 in bar graphs on the frequency-based screen and displays the phase of each RF generator in a color-coded bar graph, as the status information. Therefore, the status information mainly on the frequency of each RF generator and also on the phase thereof can be recognized intuitively and easily. Further, it is possible to easily determine whether the state of the RF generator is good or bad or whether adjustment is necessary or not.

Further, in accordance with the device of the present disclosure, the terminal device 14 connected to the RF generator 10 displays the phases of the plurality of RF generators 10 in pie charts on the phase-based screen, as the status information, and displays the frequency of each RF generator in different colors. Therefore, the status information mainly on the phase of each RF generator and also on the frequency thereof can be recognized intuitively and easily. Further, it is possible to easily determine whether the state of the RF generator is good or bad or whether adjustment is necessary or not.

Further, in accordance with the device of the present disclosure, the terminal device 14 connected to the RF generator 10 displays, as a line graph, the progress from the start of the impedance matching with the plasma processing apparatus 16 to the completion of the matching on the frequency-based screen. Therefore, the transition states of the plurality of RF generators during the impedance matching can be easily observed.

The present disclosure is not limited to the above-described embodiment, and can be variously modified without departing from the scope of the present disclosure. For example, in the above-described embodiment, the frequency or the phase of each RF generator 10 is illustrated by the color tone of the figure. However, the power may be illustrated by the color tone.

In the above-described embodiment, the status information of each RF generator 10 is displayed by changing the color tones of the figure. However, the status information may be displayed by changing the patterns or shapes of the figure.

In this case, as described in FIGS. 7 and 8, for example, the pattern or the shape of the figure is defined for each predetermined range of the status. Even in the case of displaying the status using the pattern or the shape of the figure, it is more preferable to display the status change in a stepwise manner.

For example, in the case of a pattern, it is preferable that the pattern becomes complicated or the gray level of the pattern approaches one side (light side or dark side) as the state approaches the upper limit value or the lower limit value. Further, in the case of a shape, it is preferable to change the display mode so that the shape approaches the round shape or a predetermined shape as the state approaches the upper limit value or the lower limit value.

Further, the color tones, the patterns, and the shapes of the figures may be combined and displayed. By changing the display mode of the figures, the same effect as that of the above-described embodiment can be obtained.

INDUSTRIAL APPLICABILITY

The present disclosure is suitable for a terminal device and an RF generator capable of intuitively and easily displaying the status information of the RF generator in the process and easily determining whether the state is good or bad and whether the adjustment is necessary or not. This application claims priority to Japanese Patent Application No. 2020-041472 filed on Mar. 11, 2020, the entire contents of which are incorporated herein by reference.

DESCRIPTION OF REFERENCE NUMERALS

10: RF generator
11: RF device
12: controller
13: detector
14: terminal device
15: matching device
16: plasma processing apparatus
111: excitation amplifier
112: amplifier
121: setting device
122: calculator
123: communication device
141: controller
142: storage device
143: interface device
144: display device
145: input device

The invention claimed is:

1. A terminal device for displaying status information of a plurality of Radio Frequency (RF) generators, wherein the status information includes an output power and a phase, comprising:
    a display screen;
    a controller; and
    a memory storing instructions thereon, the instructions when executed by the controller causing the controller to:
    display, on the display screen, the output power of an outputted RF signal of each of the plurality of RF generators as a figure of a bar graph over a frequency;
    display, on the display screen, the phase of the outputted RF signal of each of the plurality of RF generators by a color tone of the corresponding figure; and
    change the color tone of the corresponding figure displayed on the display screen according to a change of the phase of the outputted RF signal of each of the plurality of RF generators.

2. The terminal device of claim 1, wherein the instructions when executed by the controller further cause the controller to:
    display, on the display screen, a progress of impedance matching with a load;
    display, on the display screen, a bar graph at a start of the impedance matching and a bar graph at a completion of the impedance matching; and
    display, on the display screen, a line graph indicating frequency fluctuation during the progress.

3. The terminal device of claim 1, wherein the instructions when executed by the controller further cause the controller to:
    display, on the display screen, a selection screen on which the specific item of the status information is selectable.

4. The terminal device of claim 1, wherein the instructions when executed by the controller further cause the controller to:
    display, on the display screen, a set value set by an operator when the figures are displayed.

5. An Radio Frequency (RF) generator comprising the terminal device according to claim 1.

6. A terminal device for displaying status information of a plurality of Radio Frequency (RF) generators, wherein the status information includes an output power, a phase, and a frequency, comprising:
    a display screen;
    a controller; and
    a memory storing instructions thereon, the instructions when executed by the controller causing the controller to:
    display, on the display screen, the phase of an outputted RF signal of each of the plurality of RF generators as a direction where a figure is placed on circles;
    display, on the display screen, the output power of the outputted RF signal of each of the plurality of RF generators as a position where the corresponding figure is placed on the circles; and
    display, on the display screen, the frequency of the outputted RF signal of each of the plurality of RF generators by a color tone of the corresponding figure; and
    change the color tone of the corresponding figure displayed on the display screen according to a change of the frequency of the outputted RF signal of each of the plurality of RF generators.

7. The terminal device of claim 6, wherein the instructions when executed by the controller further cause the controller to:
   display, on the display screen, a selection screen on which the specific item of the status information is selectable.

8. The terminal device of claim 6, wherein the instructions when executed by the controller further cause the controller to:
   display, on the display screen, a set value set by an operator when the figures are displayed.

9. An Radio Frequency (RF) generator comprising the terminal device according to claim 6.

\* \* \* \* \*